United States Patent
Furihata et al.

(10) Patent No.: US 9,520,522 B2
(45) Date of Patent: Dec. 13, 2016

(54) METHOD OF MANUFACTURING SOLAR CELL MODULE

(71) Applicant: SHIN-ETSU CHEMICAL CO., LTD., Tokyo (JP)

(72) Inventors: Tomoyoshi Furihata, Annaka (JP); Atsuo Ito, Annaka (JP); Hiroto Ohwada, Annaka (JP); Hyung Bae Kim, Annaka (JP); Sumio Sekiyama, Annaka (JP); Junichi Tsukada, Annaka (JP); Atsushi Yaginuma, Annaka (JP); Naoki Yamakawa, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 326 days.

(21) Appl. No.: 14/045,352

(22) Filed: Oct. 3, 2013

(65) Prior Publication Data
US 2014/0099746 A1    Apr. 10, 2014

(30) Foreign Application Priority Data
Oct. 4, 2012   (JP) ................................. 2012-221805

(51) Int. Cl.
*H01L 31/18*   (2006.01)
*H01L 31/0203*   (2014.01)
*H01L 31/048*   (2014.01)

(52) U.S. Cl.
CPC .......... *H01L 31/18* (2013.01); *H01L 31/0203* (2013.01); *H01L 31/048* (2013.01); *Y02E 10/50* (2013.01)

(58) Field of Classification Search
CPC ..... H01L 31/0203; H01L 31/048; H01L 31/18
See application file for complete search history.

(56) References Cited

U.S. PATENT DOCUMENTS

| 5,306,797 A | 4/1994 | Ikeno |
| 7,128,977 B2 | 10/2006 | Yamamoto et al. |

(Continued)

FOREIGN PATENT DOCUMENTS

| JP | 9-153631 A | 6/1997 |
| JP | 2005-179533 A | 7/2005 |

(Continued)

OTHER PUBLICATIONS

Office Action dated May 19, 2015, issued in Japanese Patent Application No. 2012-121475, with English translation (4 pages) (counterpart to U.S. Appl. No. 13/904,569).

(Continued)

*Primary Examiner* — Christopher Schatz
(74) *Attorney, Agent, or Firm* — Westerman, Hattori, Daniels & Adrian, LLP (57) ABSTRACT

A method of manufacturing a solar cell module comprising pressing a first silicone gel sheet provided on a sunlight receiving surface of a solar cell string and a second silicone gel sheet provided on an opposite side sunlight non-receiving surface of the solar cell string in vacuum to encapsulate the solar cell string with the first and second silicone gel sheets; disposing the sunlight receiving surface side of the first silicone gel sheet on one surface of a transparent light receiving panel and disposing butyl rubber in a picture frame-like shape along an outer peripheral portion of a panel where the first silicone gel sheet is not formed and laying the light receiving panel and the light non-receiving panel or back sheet over each other with the silicone gel sheet-encapsulated solar cell string on the inside, and pressing them at 100 to 150° C. in vacuum to press bond the light receiving surface panel and the light non-receiving surface panel or back sheet to each other through the butyl rubber.

3 Claims, 3 Drawing Sheets

(56) References Cited

U.S. PATENT DOCUMENTS

| | | |
|---|---|---|
| 8,999,743 B2 | 4/2015 | Furihata et al. |
| 2005/0250903 A1 | 11/2005 | Tanaka et al. |
| 2006/0207646 A1 | 9/2006 | Terreau et al. |
| 2006/0275617 A1 | 12/2006 | Miyoshi et al. |
| 2008/0185035 A1* | 8/2008 | Hayes ............... B32B 17/10036 136/251 |
| 2008/0276983 A1 | 11/2008 | Drake et al. |
| 2009/0159117 A1 | 6/2009 | Ferri et al. |
| 2009/0194156 A1 | 8/2009 | Grommesh et al. |
| 2009/0320921 A1 | 12/2009 | Grommesh et al. |
| 2010/0275992 A1 | 11/2010 | Watanabe |
| 2011/0005066 A1 | 1/2011 | Crofoot et al. |
| 2011/0036389 A1 | 2/2011 | Hardikar et al. |
| 2011/0036390 A1 | 2/2011 | Nelson et al. |
| 2011/0061724 A1 | 3/2011 | Houle et al. |
| 2011/0132437 A1 | 6/2011 | Kost et al. |
| 2011/0139224 A1 | 6/2011 | Krajewski |
| 2011/0203642 A1 | 8/2011 | Byun et al. |
| 2011/0203665 A1 | 8/2011 | Kataoka |
| 2011/0214716 A1 | 9/2011 | Krajewski et al. |
| 2011/0247674 A1 | 10/2011 | Fujii et al. |
| 2012/0017980 A1 | 1/2012 | Lai |
| 2012/0129292 A1 | 5/2012 | Safir |
| 2012/0266943 A1 | 10/2012 | Li |
| 2012/0282725 A1 | 11/2012 | Hong et al. |
| 2012/0282727 A1 | 11/2012 | Basol |
| 2012/0318354 A1 | 12/2012 | Zhao et al. |
| 2012/0318438 A1 | 12/2012 | Muschiol |
| 2013/0068279 A1 | 3/2013 | Buller et al. |
| 2014/0099746 A1 | 4/2014 | Furihata et al. |

FOREIGN PATENT DOCUMENTS

| | | |
|---|---|---|
| JP | 2005-344106 A | 12/2005 |
| JP | 2007-527109 A | 9/2007 |
| JP | 2008-291148 A | 12/2008 |
| JP | 2009-515362 A | 4/2009 |
| JP | 2009-515365 A | 4/2009 |
| JP | 2011-514680 A | 5/2011 |
| JP | 2011-231309 A | 11/2011 |
| WO | 2009/091068 A1 | 7/2009 |

OTHER PUBLICATIONS

Office Action dated Apr. 20, 2015, issued in U.S. Appl. No. 13/904,569 (26 pages).

Office Action dated Feb. 28, 2014 issued in U.S. Appl. No. 13/904,569 (23 pages).

Ohl, S., et al., "Increased internal quantum efficiency of encapsulated solar cell by using two-component silicone as encapsulant material", Proc. 23rd, EU PVSEC, Valencia (2008), pp. 2693-2697.

Ketola, B., et al., "Demonstration of the Benefits of Silicone Encapsulation of PV Modules in a Large Scale Outdoor Array", Dow Corning Corporation.

U.S. Office Action dated Nov. 24, 2014, issued in U.S. Appl. No. 13/904,569 (23 pages).

Notice of Allowance dated Mar. 9, 2016, issued in U.S. Appl. No. 14/045,059 (13 pages).

Office Action dated Nov. 5, 2015, issued in U.S. Appl. No. 14/045,059 (9 pages).

Notification of Reasons for Rejection dated Aug. 18, 2015, issued in counterpart Japanese Patent Application No. 2012-221805 (2 pages).

* cited by examiner

METHOD OF MANUFACTURING SOLAR CELL MODULE

CROSS-REFERENCE TO RELATED APPLICATION

This non-provisional application claims priority under 35 U.S.C. §119(a) on Patent Application No. 2012-221805 filed in Japan on Oct. 4, 2012, the entire contents of which are hereby incorporated by reference.

TECHNICAL FIELD

The present invention relates to a method of manufacturing a solar cell module.

BACKGROUND ART

As a measure to enhance the efficiency of solar cell modules and to secure their reliability over a long term from 20 years to more than 30 years, there have been made various reports and proposals with attention paid to encapsulant materials. In connection with enhancement of efficiency, it has been reported that silicones are advantageous, in internal quantum efficiency based on transmittance characteristics for light with wavelengths of around 300 to 400 nm, as compared with ethylene-vinyl acetate copolymer (hereinafter abridged to EVA) which is the main stream of encapsulant material at present (see, for example, S. Ohl, G. Hahn, "Increased internal quantum efficiency of encapsulated solar cell by using two-component silicone as encapsulant material," Proc. $23^{rd}$, EU PVSEC, Valencia (2008), pp. 2693-2697 (Non-patent Document 1)). In addition, comparative experiments in output electric power between the cases of practically using EVA and silicones, respectively, have also been reported (see, for example, Barry Ketola, Chris Shirk, Philip Griffith, Gabriela Bunea, "DEMONSTRATION OF THE BENEFITS OF SILICONE ENCAPSULATION OF PV MODULES IN A LARGE SCALE OUTDOOR ARRAY," Dow Corning Corporation (Non-patent Document 2)).

Originally, the use of silicones as encapsulant material was already achieved in the former half of the 1970s on the basis of manufacture of solar cells for space use. In manufacturing solar cells for ground use, however, there were problems as to the cost of silicones and as to workability in encapsulating the solar cells with silicones. In view of these problems, silicones were replaced by EVA which was available at low cost and in film form in those days.

In recent years, however, close attention has come to be again paid to enhancement of efficiency and long-term reliability of solar cells. At the same time, the performance of silicones as encapsulant material (for example, low modulus properties, high transparency, and high weatherability) has come to be highly evaluated again. Thus, a variety of new encapsulating methods based on the use of silicones have been proposed.

For instance, in JP-A 2009-515365 (Patent Document 1), there is proposed encapsulation with a hot melt type sheet composed mainly of an organopolysiloxane. However, it is difficult to process the material into a single-layer sheet form while maintaining high transparency. For example, in order to process the material into a thickness of around 1 mm, the processing method is limited to casting, and pressing, due to the "brittleness" of the material. Thus, the material is not suited to mass production. In addition, although the "brittleness" can be improved by enhancing moldability (formability) through admixing the material with filler, this approach is disadvantageous in that it becomes impossible to maintain high transparency. In JP-A 2007-527109 (Patent Document 2), there is proposed a process in which interconnected solar cells are disposed on or in a liquid silicone material which coats over a substrate by use of a multi-axis robot, after which the silicone material is cured to achieve encapsulation, without air bubble entrapment. In addition, in JP-A 2011-514680 (Patent Document 3), there is proposed a process in which solar cells are disposed on a cured or semi-cured silicone in a vacuum by use of a cell press having a movable plate, to achieve encapsulation without air bubble entrapment. On the other hand, in WO 2009/091068 (Patent Document 4), there is proposed a process in which an encapsulant material, solar cells, and liquid silicone material are disposed on a glass substrate, and a back surface protective substrate is finally laid over them to form a temporary laminated body, which is pressed into close contact in vacuum at room temperature, thereby achieving encapsulation. In this method, however, it may be difficult to develop the solar cell module to the practical-use size. In any one of these processes, a step of applying or disposing a liquid silicone material is involved before or after a solar cell encapsulating step. Quite unlike the currently adopted encapsulating process based on the use of EVA, this step greatly hampers the application of silicones as encapsulant material in the solar cell module manufacturing industry. In short, any one of the above-mentioned processes proposed in the patent documents differs greatly from the conventional solar cell encapsulating method, and may be impossible to deal with the current mass-production equipment.

CITATION LIST

Patent Document 1: JP-A 2009-515365 corresponding to US 2008/276983 A1
Patent Document 2: JP-A 2007-527109 corresponding to US 2006/207646 A1
Patent Document 3: JP-A 2011-514680 corresponding to US 2011/005066 A1
Patent Document 4: WO 2009/091068 corresponding to US 2010/275992 A1
Non-patent Document 1: S. Ohl, G. Hahn, "Increased internal quantum efficiency of encapsulated solar cell by using two-component silicone as encapsulant material," Proc. $23^{rd}$, EU PVSEC, Valencia (2008), pp. 2693-2697
Non-patent Document 2: Barry Ketola, Chris Shirk, Philip Griffith, Gabriela Bunea, "DEMONSTRATION OF THE BENEFITS OF SILICONE ENCAPSULATION OF PV MODULES IN A LARGE SCALE OUTDOOR ARRAY," Dow Corning Corporation

DISCLOSURE OF INVENTION

It is an object of the present invention to provide a method of manufacturing a solar cell module capable of using a conventional solar cell module manufacturing equipment by using silicone gel sheets in encapsulating a solar cell string with silicone as an encapsulant material.

The present inventors made intensive and extensive investigations in order to attain the above object. As a result, the present inventors have found a promising method of manufacturing a solar cell module. In this method, a sunlight receiving surface and a sunlight non-receiving surface on the opposite side of a solar cell string are encapsulated between respective silicone gel sheets (a first silicone gel sheet and a second silicone gel sheet) by pressing in vacuum. Next, the sunlight receiving surface side of the first silicone gel sheet is disposed on one surface of a transparent light receiving panel which is to be a sunlight incidence surface, and butyl rubber is disposed in a picture frame-like shape along an outer peripheral portion of a panel where the first silicone gel sheet is not formed. Alternatively, the sunlight non-receiving surface side of the second silicone gel sheet is disposed on one surface of a light non-receiving panel or back sheet on the sunlight non-incidence side, and butyl rubber is disposed in a picture frame-like shape along an outer peripheral portion of a panel where the second silicone gel sheet is not formed. Furthermore, the light receiving panel and the light non-receiving panel or back sheet are laid over each other with the silicone gel sheet-encapsulated solar cell string on the inside. Then, they are pressed at 100 to 150° C. in vacuum so as to press bond the light receiving panel and the light non-receiving panel or back sheet to each other through the butyl rubber, thereby manufacturing a solar cell module. It has been found that, according to this manufacturing method, an application device for using silicone as encapsulant material is not needed, and that a vacuum laminator which has been used as the solar cell module manufacturing equipment in the related art can be employed.

Thus, according to the present invention, there is provided a method of manufacturing a solar cell module represented by the following [1] to [3].

[1] A method of manufacturing a solar cell module comprising:

pressing a first silicone gel sheet provided on a sunlight receiving surface of a solar cell string and a second silicone gel sheet provided on an opposite side sunlight non-receiving surface of the solar cell string in vacuum to encapsulate the solar cell string with the first and second silicone gel sheets;

disposing the sunlight receiving surface side of the first silicone gel sheet on one surface of a transparent light receiving panel which is to be a sunlight incidence surface and disposing butyl rubber in a picture frame-like shape along an outer peripheral portion of a panel where the first silicone gel sheet is not formed, or disposing the sunlight non-receiving surface side of the second silicone gel sheet on one surface of a light non-receiving panel or back sheet which is to be a sunlight non-incidence side and disposing butyl rubber in a picture frame-like shape along an outer peripheral portion of a panel where the second silicone gel sheet is not formed; and laying the light receiving panel and the light non-receiving panel or back sheet over each other with the silicone gel sheet-encapsulated solar cell string on the inside, and pressing them at 100 to 150° C. in vacuum to press bond the light receiving panel and the light non-receiving panel or back sheet to each other through the butyl rubber.

[2] The method of manufacturing a solar cell module according to [1], wherein the silicone gel sheet is a sheet of a silicone gel obtained by curing a silicone gel composition comprising:

(A) an organopolysiloxane having at least one silicon-bonded alkenyl group in one molecule and represented by the following average compositional formula (1):

$$R_a R^1_b SiO_{(4-a-b)/2} \qquad (1)$$

wherein R is an alkenyl group, $R^1$ is independently an unsubstituted or substituted monovalent hydrocarbon group not having any aliphatic unsaturated bond, a is a positive number of 0.0001 to 0.2, b is a positive number of 1.7 to 2.2, and a+b is 1.9 to 2.4;

(B) an organohydrogenpolysiloxane having at least two silicon-bonded hydrogen atoms in one molecule; and (C) a platinum catalyst, the silicone gel having a penetration of 30 to 200.

[3] The method of manufacturing a solar cell module according to [1] or [2], wherein the thickness of the silicone gel sheet is 200 to 1,000 μm.

ADVANTAGEOUS EFFECTS OF INVENTION

The method of manufacturing a solar cell module according to the present invention ensures that a vacuum laminator, which is an equipment used for manufacturing a solar cell module using EVA films in the related art, can be employed in carrying out a step of encapsulating a solar cell string between silicone gel sheets and a step of encapsulating the silicone gel sheets (with the solar cell element encapsulated therebetween) between a light receiving panel and a light non-receiving panel or back sheet. Consequently, a solar cell module can be manufactured without preparing a liquid silicone applying device, which has been needed for manufacturing a silicone-encapsulated solar cell module in the related art.

DESCRIPTION OF EMBODIMENTS

Now, preferred embodiments of the method of manufacturing a solar cell module of the present invention will be described below.

In the method of manufacturing a solar cell module of the present invention, silicone gel sheets are used for encapsulation of a solar cell string.

In the case of obtaining a silicone gel sheet, a silicone gel composition is applied to a base member and is cured to form a silicone gel layer, and, if required, a protective sheet is peelably laid on the silicone gel layer. Incidentally, as the base member, there is preferably used a base member from which the silicone gel layer (silicone gel sheet) can be peeled off. Specifically, a flexible thin sheet-shaped material such as polyethylene terephthalate film, polypropylene film, papers, and fabrics is used as the base member. Ordinarily, a material wound into a roll form is used as the base member. The base member is continuously coated with the silicone gel material (composition) described below by use of a coating apparatus. As the coating apparatus, one of those which have been known such as comma coater, reverse coater, bar coater, and die coater is used. After the silicone gel material is applied to the base member by use of the coating apparatus, the silicone gel material is cured by heating at 100 to 300° C. for about five minutes, to form a silicone gel sheet. The heating temperature is preferably in the range of 120 to 200° C. A protective sheet is adhered to a surface, on the silicone gel side, of the silicone gel sheet formed in this manner, whereby the silicone gel sheet is protected and handling thereof is facilitated. As the material for the protective sheet, a flexible thin sheet-shaped material such as polyethylene terephthalate film, polypropylene film, papers, and fabrics is used, like the material for the base member.

It is preferable on a practical use basis to control the thickness of the silicone gel sheet to within the range of 200 to 1,000 µm, more preferably 300 to 800 µm. If the thickness is less than 200 µm, it becomes difficult for the advantageous features of the cured silicone gel product such as low modulus and low hardness to be displayed. As a result, solar cell elements may be cracked in the manufacturing process in which the solar cell elements including a semiconductor substrate are sandwiched between panels. Especially, in outdoor environments where temperature variations are generated, it may become impossible for differences in linear expansion coefficient or modulus between the solar cell element surface and a wiring connection part to be absorbed, leading to embrittlement of the solar cell elements. On the other hand, if the thickness is larger than 1,000 µm, longer time is required for curing of the silicone gel sheet, and the amount of silicone gel to be used is increased, possibly leading to a rise in cost.

Furthermore, the penetration of the silicone gel after curing thereof, in terms of penetration measured by use of a ¼ cone according to JIS K 2220, is preferably 30 to 200, more preferably 40 to 150. If the penetration is below 30, it becomes difficult for the advantageous features of the cured silicone gel product such as low modulus and low hardness to be displayed. Consequently, solar cell elements may be cracked in the manufacturing process in which the solar cell elements including a semiconductor substrate are sandwiched between panels. Particularly, in outdoor environments where temperature variations are generated, it may become impossible for differences in linear expansion coefficient or modulus between the solar cell element surface and a wiring connection part to be absorbed, leading to embrittlement of the solar cell elements. If the penetration exceeds 200, on the other hand, the cured silicone gel product would become unable to maintain its form and would flow.

Now, the silicone gel composition will be described below. The silicone gel composition may be crosslinked by a method of any of condensation curing type, UV curing type, organic peroxide curing type, and addition curing type based on the use of a platinum catalyst. The silicone gel is preferably composed of a cured product of an addition-curable silicone gel composition which involves no by-products and which is little susceptible to discoloration. Specifically, the silicone gel composition to be used comprises:

(A) an organopolysiloxane having at least one silicon-bonded alkenyl group in one molecule represented by the following average compositional formula (1):

$$R_a R^1_b SiO_{(4-a-b)/2} \quad (1)$$

where R is an alkenyl group, $R^1$ is independently an unsubstituted or substituted monovalent hydrocarbon group not having any aliphatic unsaturated bond, a is a positive number of 0.0001 to 0.2, b is a positive number of 1.7 to 2.2, and a+b is 1.9 to 2.4;

(B) an organohydrogenpolysiloxane having at least two silicon-bonded hydrogen atoms in one molecule; and (C) a platinum catalyst.

The component (A) is a main component (base polymer) of the silicone gel composition. The component (A) is an organopolysiloxane which has at least one silicon-bonded alkenyl group (the expression "silicon-bonded alkenyl group" herein means an alkenyl group bonded to a silicon atom), preferably at least two silicon-bonded alkenyl groups in one molecule and which is represented by the above-mentioned average compositional formula (1).

In the above formula (1), R is an alkenyl group having 2 to 6 carbon atoms, preferably 2 to 4 carbon atoms, and more preferably 2 to 3 carbon atoms. Specific examples of the alkenyl group include vinyl, allyl, propenyl, isopropenyl, butenyl, and isobutenyl groups, among which preferred is vinyl group. $R^1$ is independently an unsubstituted or substituted monovalent hydrocarbon group which does not have any aliphatic unsaturated bond and which has 1 to 10 carbon atoms, preferably 1 to 6 carbon atoms. Specific examples of the hydrocarbon group include: alkyl groups such as methyl, ethyl, propyl, isopropyl, butyl, isobutyl, tert-butyl, pentyl, hexyl, cyclohexyl, octyl, and decyl groups; aryl groups such as phenyl and tolyl groups; aralkyl groups such as benzyl, and phenylethyl groups; substituted groups obtained by substituting at least one hydrogen atoms in the unsubstituted group with a halogen atom such as chlorine, bromine, and fluorine, such as chloromethyl and 3,3,3-trifluoropropyl groups. Among these groups, preferred in view of easy synthesis are methyl, phenyl, and 3,3,3-trifluoropropyl groups.

In addition, letter a should be a positive number of 0.0001 to 0.2, and is preferably a positive number of 0.0005 to 0.1, while letter b should be a positive number of 1.7 to 2.2, and is preferably a positive number of 1.9 to 2.02, provided that a+b should be in the range of 1.9 to 2.4, and is preferably in the range of 1.95 to 2.05.

This component should have at least one silicon-bonded alkenyl group, preferably 2 to 50 silicon-bonded alkenyl groups, and more preferably 2 to 10 silicon-bonded alkenyl groups in one molecule. It suffices for the values of the above-mentioned a and b to be so selected that this condition concerning the silicon-bonded alkenyl groups is satisfied.

The molecular structure of the organopolysiloxane is not particularly restricted, and may be a straight chain structure or may be a branched chain structure which includes, for example, an $RSiO_{1/2}$ unit (R is the same as above-mentioned), an $R^1SiO_{1/2}$ unit ($R^1$ is the same as above-mentioned), or an $SiO_2$ unit. Preferably, the organopolysiloxane is a straight chain diorganopolysiloxane wherein the backbone chain is basically composed of repetition of diorganosiloxane units and both ends of the molecular chain are each capped (blocked) with a triorganosiloxy group, typically an organopolysiloxane represented by the following general formula (1a):

In the formula (1a), $R^2$ is independently an unsubstituted or substituted monovalent hydrocarbon group which does not have any aliphatic unsaturated bond, and $R^3$ is independently an unsubstituted or substituted monovalent hydrocarbon group which does not have any aliphatic unsaturated bond or an alkenyl group, provided that at least one of the groups $R^3$ is an alkenyl group. In the case where either of the groups $R^3$ at both ends of the molecular chain is an alkenyl group, k is an integer of 40 to 1,200, m is an integer of 0 to 50, and n is an integer of 0 to 50. In the case where neither of the groups $R^3$ at both ends of the molecular chain is an alkenyl group, k is an integer of 40 to 1,200, m is an integer of 1 to 50, particularly an integer of 2 to 50, and n is an integer of 0 to 50, provided that m+n is at least 1, preferably at least 2.

In the above formula (1a), the unsubstituted or substituted monovalent hydrocarbon group which does not have any aliphatic unsaturated bond such as an alkenyl group and which is represented by $R^2$ has 1 to 10 carbon atoms, preferably 1 to 6 carbon atoms. Specific examples of the group $R^2$ include the groups mentioned above as examples of the group $R^1$, among which preferred in view of easy synthesis are methyl, phenyl, and 3,3,3-trifluoropropyl groups.

In addition, the unsubstituted or substituted monovalent hydrocarbon group which does not have any aliphatic unsaturated bond and which is represented by $R^3$ has 1 to 10 carbon atoms, preferably 1 to 6 carbon atoms. Specific examples of the group $R^3$ include the groups mentioned above as examples of the group $R^1$, among which preferred in view of easy synthesis are methyl, phenyl, and 3,3,3-trifluoropropyl groups. The alkenyl group represented by $R^3$ has 2 to 6 carbon atoms, preferably 2 to 4 carbon atoms, and more preferably 2 to 3 carbon atoms. Specific examples of the alkenyl group represented by $R^3$ include vinyl, allyl, propenyl, isopropenyl, butenyl, and isobutenyl groups, among which preferred is vinyl group.

In the above formula (1a), in the case where either of the groups $R^3$ at both ends of the molecular chain is an alkenyl group, it is preferable that k is an integer of 100 to 1,000, m is an integer of 0 to 40, and n is 0. In the case where neither of the groups $R^3$ at both ends of the molecular chain is an alkenyl group, it is preferable that k is an integer of 100 to 1,000, m is an integer of 2 to 40, and n is 0.

Examples of the organopolysiloxane represented by the above formula (1a) include both end dimethylvinylsiloxy-blocked dimethylpolysiloxane, both end dimethylvinylsiloxy-blocked dimethylsiloxane-methylvinylsiloxane copolymers, both end dimethylvinylsiloxy-blocked dimethylsiloxane-diphenylsiloxane copolymer, both end dimethylvinylsiloxy-blocked dimethylsiloxane-methylvinylsiloxane-diphenylsiloxane copolymers, both end dimethylvinylsiloxy-blocked methyltrifluoropropylpolysiloxane, both end dimethylvinylsiloxy-blocked dimethylsiloxane-methyltrifluoropropylsiloxane copolymers, both end dimethylvinylsiloxy-blocked dimethylsiloxane-methyltrifluoropropylsiloxane-methylvinylsiloxane copolymers, both end trimethylsiloxy-blocked dimethylsiloxane-vinylmethylsiloxane copolymers, both end trimethylsiloxy-blocked dimethylsiloxane-vinylmethylsiloxane-diphenylsiloxane copolymers, both end trimethylsiloxy-blocked vinylmechylsiloxane-methyltrifluoropropylsiloxane copolymers, trimethylsiloxy dimethylvinylsiloxy-end blocked dimethylpolysiloxane, trimethylsiloxy dimethylvinylsiloxy-end blocked dimethylsiloxane-methylvinylsiloxane copolymers, trimethylsiloxy dimethylvinylsiloxy-end blocked dimethylsiloxane-diphenylsiloxane copolymers, trimethylsiloxy dimethylvinylsiloxy-end blocked dimethylsiloxane-diphenylsiloxane-methylvinylsiloxane copolymers, trimethylsiloxy dimethylvinylsiloxy-end blocked methyltrifluoropropylpolysiloxane, trimethylsiloxy dimethylvinylsiloxy-end blocked dimethylsiloxane-methyltrifluoropropylsiloxane copolymers, trimethylsiloxy dimethylvinylsiloxy-end blocked dimethylsiloxane-methyltrifluoropropylsiloxane-methylvinylsiloxane copolymers, both end methyldivinylsiloxy-blocked dimethylpolysiloxane, both end methyldivinylsiloxy-blocked dimethylsiloxane-methylvinylsiloxane copolymers, both end methyldivinylsiloxy-blocked dimethylsiloxane-diphenylsiloxane copolymers, both end methyldivinylsiloxy-blocked dimethylsiloxane-methylvinylsiloxane-diphenylsiloxane copolymers, both end methyldivinylsiloxy-blocked methyltrifluoropropylpolysiloxane, both end methyldivinylsiloxy-blocked dimethylsiloxane-methyltrifluoropropylsiloxane copolymers, both end methyldivinylsiloxy-blocked dimethylsiloxane-methyltrifluoropropylsiloxane-methylvinylsiloxane copolymers, both end trivinylsiloxy-blocked dimethylpolysiloxane, both end trivinylsiloxy-blocked dimethylsiloxane-methylvinylsiloxane copolymers, both end trivinylsiloxy-blocked dimethylsiloxane-diphenylsiloxane copolymers, both end trivinylsiloxy-blocked dimethylsiloxane-methylvinylsiloxane-diphenylsiloxane copolymers, both end trivinylsiloxy-blocked methyltrifluoropropylpolysiloxane, both end trivinylsiloxy-blocked dimethylsiloxane-methyltrifluoropropylsiloxane copolymers, and both end trivinylsiloxy-blocked dimethylsiloxane-methyltrifluoropropylsiloxane-methylvinylsiloxane copolymers.

The viscosity of the organopolysiloxane is not particularly limited. In view of good workability in handling the composition and good strength and fluidity of the cured product obtained, the viscosity as measured at 25° C. by a rotational viscometer is preferably 50 to 100,000 mPa·s, more preferably 1,000 to 50,000 mPa·s.

Next, the component (B) reacts with the above-mentioned component (A), and acts as a crosslinking agent. The component (B) is an organohydrogenpolysiloxane having at least 2 silicon-bonded hydrogen atoms (the expression "silicon-bonded hydrogen atom" used herein means a hydrogen atom bonded to a silicon atom, namely, it means a SiH group (hydrosilyl group)) in one molecule. The number of the silicon-bonded hydrogen atoms in the organohydrogenpolysiloxane is preferably 2 to 30, more preferably 2 to 10, and most preferably 2 to 5 in one molecule.

The silicon-bonded hydrogen atoms contained in the organohydrogenpolysiloxane may be located at an end of the molecular chain or an intermediate position of the molecular chain, or at both of them. Although the molecular structure of the organohydrogenpolysiloxane is not specifically restricted, it may be any of straight chain, cyclic, branched chain, and three-dimensional network (resinous) structures.

The number of the silicon atoms in one molecule of the organohydrogenpolysiloxane (in other words, the polymerization degree of the organohydrogenpolysiloxane) is 20 to 1,000. From the viewpoint of good workability in handling the composition and good characteristics (low elastic modulus, low stress) of the cured product obtained, the number of silicon atoms in one molecule is preferably 40 to 1,000, more preferably 40 to 400, further preferably 60 to 300, still further preferably 100 to 300, and most preferably 160 to 300.

The viscosity of the organohydrogenpolysiloxane as measured at 25° C. by a rotational viscometer is 10 to 100,000 mPa·s, more preferably 200 to 50,000 mPa·s, and most preferably 500 to 25,000 mPa·s. Thus, an organohydrogenpolysiloxane which is liquid at room temperature (25° C.) is preferably used.

As the organohydrogenpolysiloxane, there is preferably used an organohydrogenpolysiloxane having the following average compositional formula (2):

$$R^4_c H_d SiO_{(4-c-d)/2} \quad (2)$$

where $R^4$ is independently an unsubstituted or substituted monovalent hydrocarbon groups which does not have any aliphatic unsaturated bond, c is a positive number of 0.7 to 2.2, and d is a positive number of 0.001 to 0.5, and c+d is 0.8 to 2.5.

In the above formula (2), $R^4$ is independently an unsubstituted or substituted monovalent hydrocarbon group which does not have any aliphatic unsaturated bond, and which has 1 to 10 carbon atoms, preferably 1 to 6 carbon atoms. Specific examples of the groups $R^4$ include: alkyl groups such as methyl, ethyl, propyl, isopropyl, butyl, isobutyl, tert-butyl, pentyl, neopentyl, hexyl, cyclohexyl, octyl, nonyl, and decyl groups; aryl groups such as phenyl, tolyl, xylyl, and naphthyl groups; aralkyl groups such as benzyl, phenylethyl, and phenylpropyl groups; and groups obtained by substituting at least one of the hydrogen atoms of these groups by a halogen atom such as chlorine, bromine, and fluorine, such as 3,3,3-trifluoropropyl group. Among these groups, preferred are the alkyl groups, aryl groups, and 3,3,3-trifluoropropyl group, and more preferred are methyl, phenyl, and 3,3,3-trifluoropropyl groups.

In addition, c is preferably a positive number of 1.0 to 2.1, while d is preferably a positive number of 0.001 to 0.1, more preferably a positive number of 0.005 to 0.1, further preferably a positive number of 0.005 to 0.05, and most preferably a positive number of 0.005 to 0.03. Besides, c+d is preferably in the range from 1.0 to 2.5, and is more preferably in the range from 1.5 to 2.2.

Examples of the organohydrogenpolysiloxane represented by the above formula (2) include methylhydrogensiloxane-dimethylsiloxane cyclic copolymers, both end trimethylsiloxy-blocked methylhydrogenpolysiloxane, both end trimethylsiloxy-blocked dimethylsiloxane-methylhydrogensiloxane copolymers, both end dimethylhydrogensiloxy-blocked dimethylpolysiloxane, both end dimethylhydrogensiloxy-blocked dimethylsiloxane-methylhydrogensiloxane copolymers, both end trimethylsiloxy-blocked methylhydrogensiloxane-diphenylsiloxane copolymers, both end trimethylsiloxy-blocked methylhydrogensiloxane-diphenylsiloxane-dimethylsiloxane copolymers, both end dimethylhydrogensiloxy-blocked methylhydrogensiloxane-dimethylsiloxane-diphenylsiloxane copolymers, copolymers composed of $(CH_3)_2HSiO_{1/2}$ units and $(CH_3)_3SiO_{1/2}$ units and $SiO_{1/2}$ units, copolymers composed of $(CH_3)_2HSiO_{1/2}$ units and $SiO_{1/2}$ units, and copolymers composed of $(CH_3)_2HSiO_{1/2}$ units and $(C_6H_5)_3SiO_{1/2}$ units and $SiO_{1/2}$ units.

The amount of component (B) is at least 1 part by weight, preferably at least 3 parts by weight based on 100 parts by weight of the component (A). Considering the upper limit of the amount, the amount is preferably 15 to 500 parts by weight, more preferably 20 to 500 parts by weight, and further preferably 30 to 200 parts by weight per 100 parts by weight of component (A). While satisfying the above-mentioned condition, the amount of this component (B) should be such that the number of the silicon-bonded hydrogen atoms present in this component (B) per one silicon-bonded alkenyl group present in the component (A) is in the range of 0.3 to 2.5, preferably 0.5 to 2, and more preferably 0.6 to 1.5. If this amount is less than 1 part by weight, the cured product obtained is susceptible to oil bleeding. If the number of the silicon-bonded hydrogen atoms per one silicon-bonded alkenyl group is less than 0.3, the crosslink density would be so low that the composition obtained may fail to be cured, or, even if cured, the cured product may show lowered heat resistance. If the number of silicon-bonded hydrogen atoms per one silicon-bonded alkenyl group is more than 2.5, foaming due to a dehydrogenation reaction or lowering in the heat resistance of the cured product obtained or generation of oil bleeding may result.

Furthermore, the component (C) is used as a catalyst for accelerating an addition reaction between the silicon-bonded alkenyl groups in the component (A) and the silicon-bonded hydrogen atoms in the component (B). The component (C) is a platinum catalyst (platinum or a platinum compound), and those which have been known can be used. Specific examples of the platinum catalyst include: platinum black, chloroplatinic acid, or alcohol-modified products of chloroplatinic acid; and complexes of chloroplatinic acid with olefin, aldehyde, or vinylsiloxane or acetylene alcohol.

The amount of this component (C) may be an effective amount, which can be appropriately increased or decreased according to a desired curing rate. The amount, in terms of the weight of platinum atoms based on the total amount of the component (A) and the component (B), is 0.1 to 1,000 ppm, preferably 1 to 300 ppm. If the amount is too large, the cured product obtained may show lowered heat resistance.

The silicone gel composition can be prepared by mixing the above-mentioned components (A) to (C) (inclusive of optional components, if used) according to an ordinary method. In the case of mixing, the components to be mixed may be mixed after divided into two or more parts, as required. For instance, the components (A) to (C) may be mixed after divided into a part consisting of a portion of the component (A) and the component (C) and a part consisting of the remainder of the component (A) and the component (B).

In the case of curing the silicone gel composition to obtain a silicone gel, the curing conditions are preferably a temperature of 80 to 150° C. and a time of five to 30 minutes, according to an ordinary curing method.

Now, a process of manufacturing the solar cell module by use of the silicone gel sheets obtained as above will be described below.

First, in the case where a protective film is adhered to a silicone gel sheet (a first silicone gel sheet), the protective film is peeled off, a solar cell string is arranged on one surface of the first silicone gel sheet with the light receiving surface side in contact with the silicone gel sheet. The solar cell string thus arranged on the first silicone gel sheet is disposed on a vacuum laminator. Another silicone gel sheet (a second silicone gel sheet) deprived of a protective film is laid over the first silicone gel sheet on the side of the light receiving surface so that light non-receiving surface on the side opposite to the light receiving surface of the solar cell string is put into contact with the second silicone gel sheet (see FIG. 1). Further, the assembly is pressed together in vacuum, thereby to encapsulate the solar cell strings with the first and second silicone gel sheets (FIG. 2).

Figure 1:
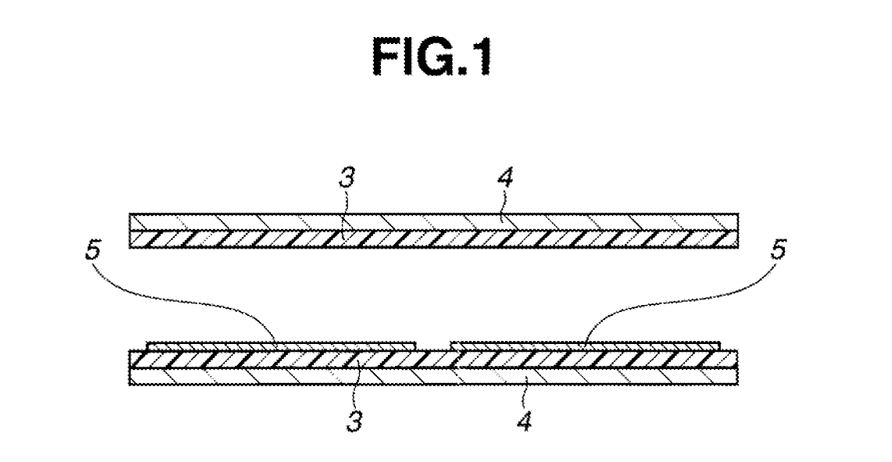
FIG. 1 is a sectional view of a state in which solar cell strings are disposed on a silicone gel sheet.
Figure 2:
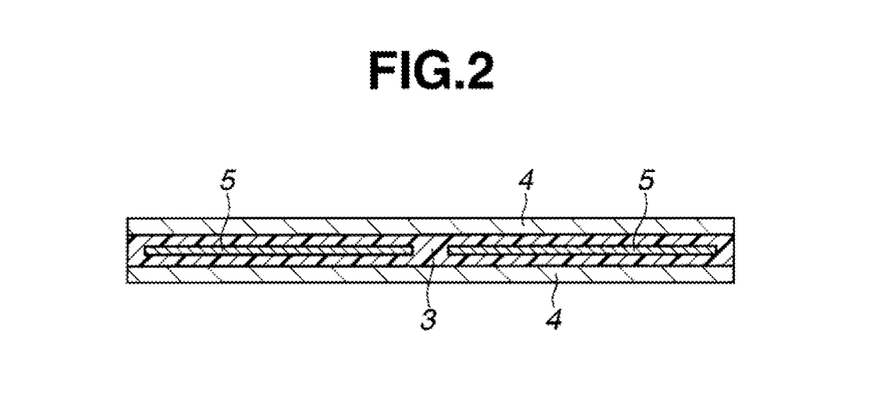
FIG. 2 is a sectional view of a state in which solar cell strings are encapsulated with silicone gel sheets by a vacuum laminator.

Incidentally, in FIGS. 1 and 2, numeral 3 denotes a silicone gel sheet, numeral 4 denotes a base member, and numeral 5 denotes the solar cell string.

In this case, a process reverse to the above may also be adopted. In the reverse process, the solar cell string is first arranged on a silicone gel sheet (a second silicone gel sheet) on the light non-receiving surface side (opposite to the light receiving surface) so that the non-receiving surface of the string opposite to the light receiving surface is in contact with the silicone gel sheet, then another silicone gel sheet (a first silicone gel sheet) is laid over the second silicone gel sheet so that the light receiving surface of the solar cell string is put into contact with the first silicone gel sheet, and the assembly is pressed together in vacuum so as to encapsulate the solar cell string with the first and second silicone gel sheets. Incidentally, the solar cell is produced by use of single-crystal silicon and/or polycrystalline silicon, and the solar cell string is a group of solar cells interconnected by tab wires.

In addition, at the time of pressing the stacked assembly together in vacuum, the light receiving surface side of the first silicone gel sheet or the light non-receiving surface side (opposite to the light receiving surface side) of the second silicone gel sheet may preliminarily be subjected to a plasma irradiation treatment or an excimer beam irradiation treatment, to activate the surface of the silicone gel sheet, before pressing in vacuum. Further, the temperature during the pressing in vacuum is in the range from room temperature to 150° C., according to an ordinary method.

Figure 3:
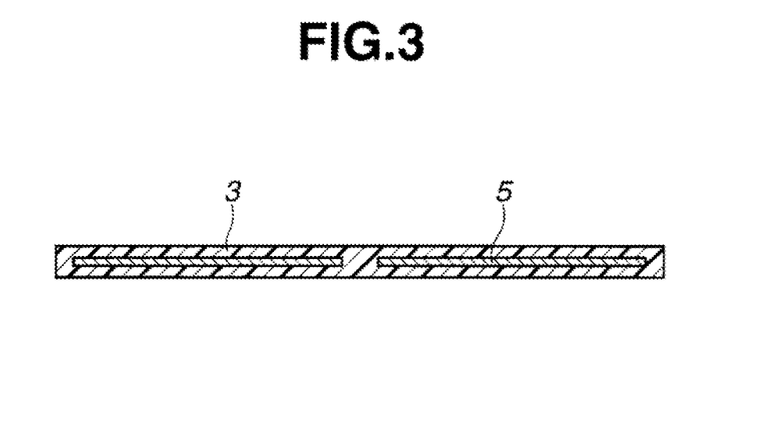
FIG. 3 is a sectional view in which a base member in FIG. 2 is peeled off.
Figure 4:
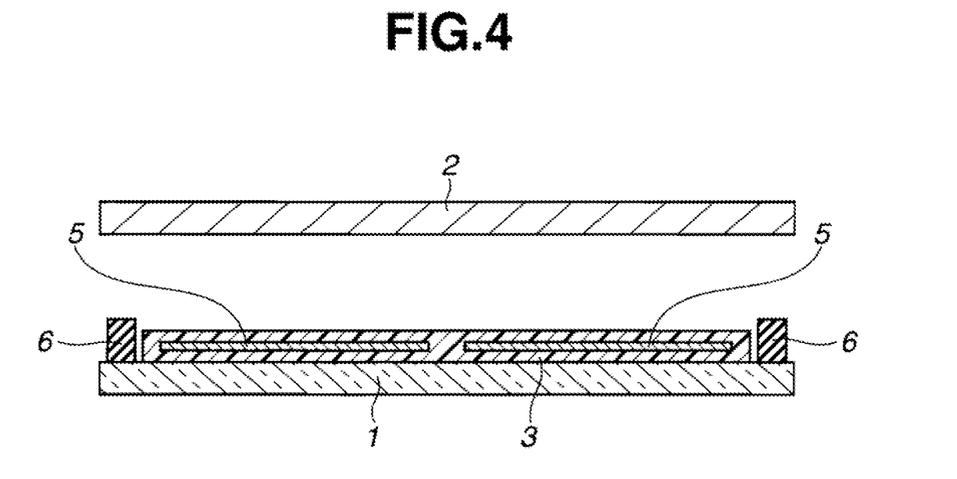
FIG. 4 is a sectional view of a state in which a silicone gel sheet having encapsulated the solar cell strings on a light receiving panel is disposed on the light receiving panel and butyl rubber is disposed.

After the encapsulation by use of the vacuum laminator, the base members of the silicone gel sheets on the light receiving surface side and the light non-receiving surface side are peeled off (FIG. 3). Thereafter, the silicone gel sheets with the solar cell string encapsulated therebetween are arranged on a light receiving panel, with the light receiving surface side in contact with the panel, and, at the same time, butyl rubber is disposed in a picture frame-like shape having a width of 5 to 20 mm along an outer peripheral portion of a panel where the first silicone gel sheet is not formed (FIG. 4). In the figure, numeral 1 denotes a transparent light receiving panel, numeral 2 denotes a light non-receiving panel or back sheet, and numeral 6 denotes butyl rubber. Besides, a process reverse to the above may also be adopted. In the reverse process, the second silicone gel sheet with the solar cell string encapsulated therebetween are first disposed on the light non-receiving panel or back sheet, and, further, the butyl rubber is disposed along the outer peripheral portion of the assembly.

In making the light receiving panel, a member having good long-term reliability in outdoor use in addition to good transparency, weatherability and impact resistance is needed. Examples of the member satisfying these conditions include tempered white glass, acrylic resin, fluoro-resin, and carbonate resin; in general, a tempered white glass with a thickness of about 3 to 5 mm is widely used.

In addition, the butyl rubber for use is a rubber preliminarily processed into a tape-like shape or a cord-like shape by use of a hot melt applicator. The butyl rubber may be of the commonly commercialized type. Since the butyl rubber is subjected to a temperature of 100 to 150° C. during the vacuum lamination in the subsequent step, however, the butyl rubber is preferably of the hot melt type that can keep its shape in the temperature range; for example, butyl rubber M-155P (produced by The Yokohama Rubber Co., Ltd.) is used.

Figure 5:
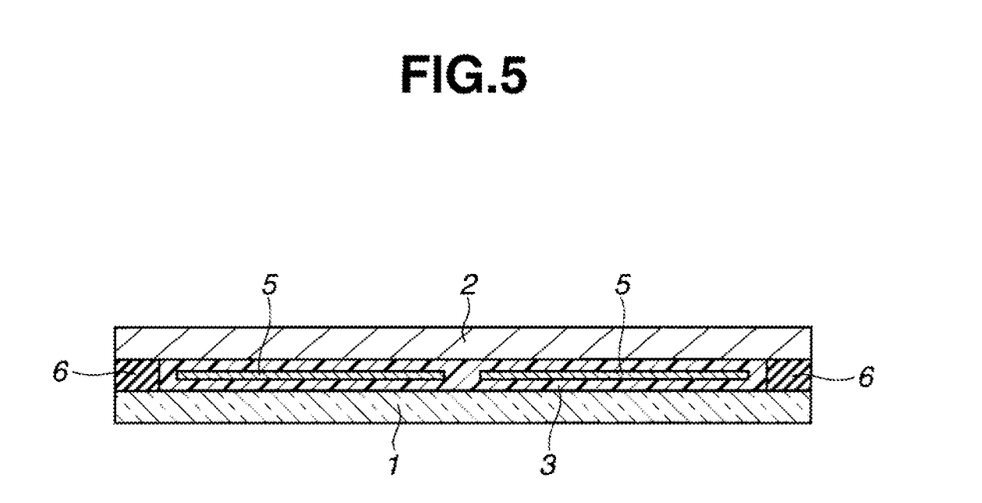
FIG. 5 is a sectional view of a solar cell module in which the butyl rubber is press bonded by a vacuum laminator.

Next, the light non-receiving panel or back sheet is disposed on the side opposite to the light receiving surface side, the silicone gel sheets with the solar cell string encapsulated therebetween are processed at a reduced pressure, or in vacuum, by the vacuum laminator, to remove air from the gap between the surface of the first silicone gel sheet on the light receiving surface side and the light receiving panel as well as from the gap between the surface of the second silicone gel sheet on the light non-receiving surface side and the light non-receiving panel or back sheet. Thereafter, pressing at the atmospheric pressure with heating at 100 to 150° C. is conducted for one to five minutes to press bond the butyl rubber disposed in the picture frame-like shape, thereby manufacturing a solar cell module (FIG. 5).

Here, the light non-receiving panel on the side opposite to the light receiving surface is required to efficiently radiate the heat of the solar cell string (or to efficiently lower the temperature of the solar cell string). Therefore, examples of the material for the light non-receiving panel include glass materials, synthetic resins materials, metallic materials, and their composite members. Examples of the glass materials include blue plate glass, white plate glass, and tempered glass. Examples of the synthetic resin materials include acrylic resins, polycarbonate (PC) resins, polyethylene terephthalate (PET) resins, and epoxy resins. Examples of the metallic materials include copper, aluminum, and iron. Examples of the composite members include synthetic resins supporting thereon a high thermal conductivity material such as silica, titanium oxide, alumina, or aluminum nitride.

Incidentally, as the light non-receiving panel on the side opposite to the sunlight incidence side, there may be used a member which is transparent, like the panel on the side of incidence of sunlight. This ensures that the direct reaching sunlight and the scattered light thereof can be partly transmitted to the side opposite to the sunlight incidence side. Consequently, for example where the solar cell module is installed on grassland, the part on the side opposite to the incidence surface of the solar cell module, or the part which would originally be in the shade is also irradiated with part of the sunlight, whereby growth of plants can be promoted and utilization for grazing of cattle can be realized.

In addition, in the case of using the back sheet, specific examples of the back sheet include films ETFE (ethylene-tetrafluoroethylene copolymer) films, fluoro-resin films such as PVF (polyvinyl fluoride) films, and laminate sheets having an aluminum foil or PET film sandwiched between PVF sheets.

EXAMPLES

Now, the present invention will be described in detail below by way of Examples and Comparative Examples. In the Examples, "parts" means "parts by weight," "%" means "wt %," and "Vi" represents "vinyl group." In addition, viscosity is given in values as measured at 25° C. by a rotational viscometer.

Example 1

100 parts of a both end dimethylvinylsiloxy-blocked dimethylpolysiloxane having a viscosity of 10,000 mPa·s, 63 parts of both end trimethylsiloxy-blocked dimethylsiloxane-methylhydrogensiloxane copolymer represented by the following formula (3):

and having a viscosity of 10,000 mPa·s (the number of silicon-bonded hydrogen atoms in the component (B) per one silicon-bonded alkenyl group in the component (A) (the number will hereinafter be referred to as H/Vi) was 1.05), and 0.05 parts of a dimethylpolysiloxane solution of a vinylsiloxane chloroplatinate complex having a concentration of 1% as platinum atoms, were mixed uniformly to obtain a composition. The composition thus obtained was heated at 150° C. for 30 minutes in an oven to obtain a cured product having a penetration of 75. Incidentally, the penetration was measured by use of a ¼ cone according to JIS K 2220; specifically, the penetration was measured by use of an automatic penetration tester RPM-101 produced by Rigo Co., Ltd.

Next, using the above-mentioned materials, a silicone gel sheet was produced. A comma coater was charged with the above-mentioned materials, and a 50 μm-thick polyethylene terephthalate (PET) film as a base member was coated with the composition, with such a control as to promise an overall thickness of 250 μm. Further, the coating film thus obtained was cured at 150° C. for 30 minutes in an oven to obtain a silicone gel sheet. A protective film was laminated onto the silicone gel side of the silicone gel sheet to obtain a roll of silicone gel sheet.

From the silicone gel sheet roll thus obtained, two sheets measuring 320 mm by 340 mm were blanked. First, the protective film on the first one of the silicone gel sheets was peeled off, and the exposed surface of the silicone gel sheet was irradiated with excimer laser beams of 172 nm in wavelength. Next, single-crystal solar cell strings were arranged on the irradiated surface, and the silicone gel sheet with the solar cell strings thereon was disposed in a vacuum laminator. The protective film on the other one of the silicone gel sheets was also peeled off, and the exposed surface was irradiated with excimer laser beams in the same manner as above. The second silicone gel sheet was laid over the first silicone gel sheet carrying thereon the solar cell strings on the light receiving side, and the resulting assembly (stacked body) was pressed together in vacuum at 60° C. for 20 minutes to encapsulate the solar cell strings.

Next, the PET base members on the silicone gel sheets on the light receiving surface side and the light non-receiving surface side opposite thereto were peeled off. Then, the thus obtained assembly having the solar cell strings encapsulated between the silicone gel sheets was disposed on a 3.2 mm-thick tempered white glass measuring 340 mm by 360 mm, with its light receiving surface side in contact with the glass, leaving an outer peripheral space with a width of 10 mm. At the same time, butyl rubber in a cord-like shape with a diameter of 6 mm was disposed in a picture frame-like shape in the space area.

Subsequently, a 3.2 mm-thick tempered white glass measuring 340 mm by 360 mm was placed also on the side opposite to the light receiving surface side to encapsulate the solar cell strings. The resulting assembly having the solar cell strings encapsulated between the silicone gel sheets was pressed in a vacuum atmosphere at the atmospheric pressure at 150° C. for five minutes by use of a vacuum laminator to manufacture a solar cell module A.

(Evaluation of Crack in Solar Cell Element)

Evaluation of cracks in the solar cell module A was conducted. The evaluation was carried out by visual inspection or EL (electroluminescence) light emission method, according to an ordinary method.

(Evaluation by Severe Deterioration Test)

The solar cell module A was put to a severe deterioration test by PCT (pressure cooker test). The test conditions were a temperature of 125° C., a humidity of 95%, a pressure of 2.1 atm, and a time of 100 hours. After the test, evaluation of cracks by the EL light emission method, evaluation of the presence/absence of corrosion of the tab wires by visual inspection, and evaluation of the presence/absence of intrusion of water (moisture) into the module by visual inspection were conducted.

Example 2

A comma coater was charged with the uniform liquid mixture obtained in Example 1, and a 50 μm-thick polyethylene terephthalate (PET) film as a base member was coated with the mixture, with such a control as to promise an overall thickness of 550 μm. Subsequently, a solar cell module B was manufactured in the same manner as in Example 1. The solar cell element was put to evaluation of cracking and a severe deterioration test.

Example 3

A comma coater was charged with the uniform liquid mixture obtained in Example 1, and a 50 μm-thick polyethylene terephthalate (PET) film as a base member was coated with the mixture, with such a control as to promise an overall thickness of 850 μm. Subsequently, a solar cell module C was manufactured in the same manner as in Example 1. The solar cell element was put to evaluation of cracks and a severe deterioration test.

Example 4

100 parts of a both end dimethylvinylsiloxy-blocked dimethylpolysiloxane having a viscosity of 12,000 mPa·s, 25 parts of a both end dimethylhydrogensiloxy-blocked dimethylsiloxane-methylhydrogensiloxane copolymer represented by the following formula (4):

(4)

and having a viscosity of 2,000 mPa·s (H/Vi was 1.3), and 0.05 parts of a dimethylpolysiloxane solution of a vinylsiloxane chloroplatinate complex having a concentration of 1% as platinum atoms were uniformly mixed to obtain a composition. The composition was heated in an oven at 150° C. for 30 minutes to obtain a cured product with a penetration of 40.

Next, a comma coater was charged with the above-mentioned materials, and a 50 μm-thick polyethylene terephthalate (PET) film as a base member was coated with the composition, with such a control as to promise an overall thickness of 250 μm. Subsequently, a solar cell module D was manufactured in the same manner as in Example 1, except that a 25 μm-thick ETFE film measuring 340 mm by 360 mm as a back sheet was placed on the side opposite to the light receiving surface side. The solar cell element was put to evaluation of cracks and a severe deterioration test.

Example 5

A comma coater was charged with the uniform liquid mixture obtained in Example 4, and a 50 μm-thick polyethylene terephthalate (PET) film as a base member was coated with the mixture, with such a control as to promise an overall thickness of 550 μm. Next, a solar cell module E was manufactured in the same manner as in Example 4, and the solar cell element was put to evaluation of cracks and a severe deterioration test.

Example 6

A comma coater was charged with the uniform liquid mixture obtained in Example 4, and a 50 μm-thick polyethylene terephthalate (PET) film as a base member was coated with the mixture, with such a control as to promise an overall thickness of 850 μm. Next, a solar cell module F was manufactured in the same manner as in Example 4, and the solar cell element was put to evaluation of cracks and a severe deterioration test.

Example 7

100 parts of a both end trimethylsiloxy-blocked dimethylsiloxane-methylvinylsiloxane copolymer represented by the following formula (5):

(5)

and having a viscosity of 10,000 mPa·s, 40 parts of a both end dimethylhydrogensiloxy-blocked dimethylpolysiloxane represented by the following formula (6):

(6)

and having a viscosity of 6,000 mPa·s (H/Vi was 0.95), and 0.05 parts of a dimethylpolysiloxane solution of a vinylsiloxane chloroplatinate complex having a concentration of 1% as platinum atoms were mixed uniformly to obtain a composition. The composition was heated in an oven at 150° C. for 30 minutes to obtain a cured product with a penetration of 120.

A comma coater was charged with the above-mentioned material, and a 50 μm-thick polyethylene terephthalate (PET) film as a base member was coated with the material, with such a control as to promise an overall thickness of 250 μm. A solar cell module G was manufactured in the same manner as in Example 1, and the solar cell element was put to evaluation of cracks and a severe deterioration test.

Example 8

A comma coater was charged with the uniform liquid mixture obtained in Example 7, and a 50 μm-thick polyethylene terephthalate (PET) film as a base member was coated with the mixture, with such a control as to promise an overall thickness of 550 μm. Subsequently, a solar cell module H was manufactured in the same manner as in Example 7, and the solar cell element was put to evaluation of cracks and a severe deterioration test.

Example 9

A comma coater was charged with the uniform liquid mixture obtained in Example 7, and a 50 μm-thick polyethylene terephthalate (PET) film as a base member was coated with the mixture, with such a control as to promise an overall thickness of 850 μm. Next, a solar cell module I was manufactured in the same manner as in Example 7. The solar cell element was put to evaluation of cracks and a severe deterioration test.

Example 10

A solar cell module J was manufactured in the same manner as in Example 1, except that the base member was coated with the uniform liquid mixture obtained in Example 1 by use of a comma coater in the same manner as in Example 2, with such a control as to promise an overall thickness of 550 μm, to obtain one of the two silicone gel sheets on the light receiving surface side, and that the uniform liquid mixture obtained in Example 4 was applied in the same manner as in Example 5, with such a control as to promise an overall thickness of 550 μm, to obtain the other one of the two silicone gel sheets as a panel on the side opposite to the light receiving surface side. The solar cell element was put to evaluation of cracks and a severe deterioration test.

Comparative Example 1

A comma coater was charged with the uniform liquid mixture obtained in Example 4, and a 50 μm-thick polyethylene terephthalate (PET) film as a base member was coated with the mixture, with such a control as to promise an overall thickness of 550 μm, to obtain a roll of silicone gel sheet. From this silicone gel sheet roll, two sheets measuring 340 mm by 360 mm were blanked. Next, a solar cell module K was manufactured in the same manner as in Example 4, except that butyl rubber was not disposed in the picture frame-like shape. The solar cell element was put to evaluation of cracks and a severe deterioration test.

Comparative Example 2

Using two sheets of 500 μm-thick transparent film of EVA (ethylene-vinyl acetate copolymer; with a vinyl acetate content of 28%), a single-crystal silicon solar cell element was encapsulated between two tempered white glass base members measuring 340 mm by 360 mm, based on an ordinary method. The encapsulation was carried out through melt pressure bonding by use of a vacuum laminator in a vacuum atmosphere with heating at 120° C. for 30 minutes, to thereby manufacture a solar cell module L. The solar cell element was put to evaluation of cracks and a severe deterioration test.

The results of the crack evaluation and the severe deterioration test are set forth in Table 1, together with the above-mentioned conditions.

TABLE 1

| | | Light receiving surface silicone gel sheet | | Back surface silicone gel sheet | | Number of cracks, detected by EL observation | Observation after PCT severe deterioration test | | |
|---|---|---|---|---|---|---|---|---|---|
| | Module | Penetration | Film thickness (μm) | Penetration | Film thickness (μm) | | Number of cracks | Corrosion of tab wire | Intrusion of water |
| Example 1 | A | 75 | 200 | 75 | 200 | 0 | 1 | absent | absent |
| Example 2 | B | 75 | 500 | 75 | 500 | 0 | 0 | absent | absent |
| Example 3 | C | 75 | 800 | 75 | 800 | 0 | 0 | absent | absent |
| Example 4 | D | 40 | 200 | 40 | 200 | 1 | 2 | absent | absent |
| Example 5 | E | 40 | 500 | 40 | 500 | 0 | 0 | absent | absent |
| Example 6 | F | 40 | 800 | 40 | 800 | 0 | 0 | absent | absent |
| Example 7 | G | 120 | 200 | 120 | 200 | 1 | 2 | absent | absent |
| Example 8 | H | 120 | 500 | 120 | 500 | 1 | 1 | absent | absent |
| Example 9 | I | 120 | 800 | 120 | 800 | 0 | 0 | absent | absent |
| Example 10 | J | 75 | 500 | 40 | 500 | 0 | 0 | absent | absent |
| Comparative Example 1 (no butyl rubber sealing) | K | 40 | 500 | 40 | 500 | 0 | 5 | present | present |
| Comparative Example 2 | L | EVA film/ 500 μm thick | | EVA film/ 500 μm thick | | 2 | 3 | present | present |

Japanese Patent Application No. 2012-221805 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method of manufacturing a solar cell module comprising:

pressing a first silicone gel sheet provided on a sunlight receiving surface of a solar cell string and a second silicone gel sheet provided on an opposite side sunlight non-receiving surface of the solar cell string in a first vacuum to encapsulate the solar cell string with the first and second silicone gel sheets; and then disposing a sunlight receiving surface side of the first silicone gel sheet on one surface of a transparent light receiving panel which is to be a sunlight incidence surface except an outer peripheral region thereof and disposing butyl rubber in a picture frame-like shape along the outer peripheral region of the one surface of the transparent light receiving panel which is to be a sunlight incidence surface where the first silicone gel coating is not formed, or disposing a sunlight non-receiving surface side of the second silicone gel sheet on one surface of a light non-receiving panel or back sheet which is to be a sunlight non-incidence side except an outer peripheral region thereof and disposing butyl rubber in a picture frame-like shape along the outer peripheral region of the one surface of the sunlight non-receiving panel or back sheet which is to be a sunlight non-incidence side where the second silicone gel coating is not formed and laying the light receiving panel and the light non-receiving panel or back sheet over each other with the silicone gel sheet-encapsulated solar cell string on the inside, and pressing them at 100 to 150° C. in a second vacuum for at least one minute but no longer than five minutes to press bond the light receiving panel and the light non-receiving panel or back sheet to each other through the butyl rubber, and wherein the first silicone gel sheet and the second silicone gel sheet are a sheet of a silicone gel obtained by curing a silicone gel composition comprising:

(A) an organopolysiloxane having at least one silicon-bonded alkenyl group in one molecule and represented by the following average compositional formula (1):

$$R_a R^1_b SiO_{(4-a-b)/2} \quad (1)$$

wherein R is an alkenyl group, $R^1$ is independently an unsubstituted or substituted monovalent hydrocarbon group not having any aliphatic unsaturated bond, a is a positive number of 0.0001 to 0.2, b is a positive number of 1.7 to 2.2, and a+b is 1.9 to 2.4;

(B) an organohydrogenpolysiloxane having at least two silicon-bonded hydrogen atoms in one molecule; and (C) a platinum catalyst, the silicone gel having a penetration of 30 to 200.

2. The method of manufacturing a solar cell module according to claim 1, wherein the thickness of the first silicone gel sheet and the second silicone gel sheet is 200 to 1,000 μm.

3. The method of manufacturing a solar cell module according to claim 1, wherein before the first vacuum the sunlight receiving surface side of the first silicone gel sheet or the sunlight non-receiving surface side of the second silicone gel sheet are subjected to a plasma irradiation treatment or an excimer beam irradiation treatment.

* * * * *